(12) United States Patent
Aoyama

(10) Patent No.: US 6,433,417 B1
(45) Date of Patent: Aug. 13, 2002

(54) ELECTRONIC COMPONENT HAVING IMPROVED SOLDERING PERFORMANCE AND ADHESION PROPERTIES OF THE LEAD WIRES

(75) Inventor: Makoto Aoyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/261,199

(22) Filed: Mar. 3, 1999

(30) Foreign Application Priority Data

Mar. 6, 1998 (JP) .......................................... 10-054920
Feb. 10, 1999 (JP) .......................................... 11-033435

(51) Int. Cl.⁷ .............................................. H01L 23/48
(52) U.S. Cl. ...................................... 257/696; 257/673
(58) Field of Search ...................... 257/696, 673, 257/690, 692, 737, 277, 738

(56) References Cited

U.S. PATENT DOCUMENTS

| | | | | |
|---|---|---|---|---|
| 4,510,677 A | * | 4/1985 | Collumeau | 29/588 |
| 5,616,953 A | * | 4/1997 | King et al. | 257/666 |
| 5,895,969 A | * | 4/1999 | Masuda et al. | 257/666 |
| 5,910,010 A | * | 6/1999 | Nishizawa et al. | 438/15 |
| 6,002,167 A | * | 12/1999 | Hatano et al. | 257/666 |
| 6,084,293 A | * | 7/2000 | Ohuchi | 257/686 |
| 6,169,323 B1 | * | 1/2001 | Sakamoto | 257/667 |

FOREIGN PATENT DOCUMENTS

| | | | |
|---|---|---|---|
| JP | 59-161851 | * | 9/1984 |
| JP | 5-343586 | * | 7/1987 |
| JP | 05-347373 | * | 6/1992 |
| JP | 5-55438 | * | 3/1993 |
| WO | WO 87/04008 | * | 7/1987 |

* cited by examiner

*Primary Examiner*—Phat X. Cao
(74) *Attorney, Agent, or Firm*—Arent Fox Kintner Plotkin & Kahn, PLLC

(57) ABSTRACT

Electrodes of the electronic component chip is electrically connected with the end parts of the leads and the electronic component chip and the end parts of the leads are covered by the package with the leads which are extended out from the package are bent along the outer wall of the package, and a solder bump of low melting point is held in the gap between the leads and the package. By adopting this structure, soldering performance in mounting can be improved by a simple work while securing the moisture resistance between the leads and the package, and without requiring the work of number of steps of solder plating on the exposed leads after molding.

9 Claims, 6 Drawing Sheets

ELECTRONIC COMPONENT HAVING IMPROVED SOLDERING PERFORMANCE AND ADHESION PROPERTIES OF THE LEAD WIRES

FIELD OF THE INVENTION

The present invention relates to an electronic component with which a package is formed by molding a solid electrolytic capacitor or a semiconductor chip, with lead wires led out from the package. More particularly, the invention relates to an electronic component having improved soldering performance and adhesion properties of the lead wires when they are soldered to the circuit substrate or the like.

BACKGROUND OF THE INVENTION

Electronic component, e.g., a tantalum capacitor, is made by first electrically connecting a capacitor element 21 formed of a sintered body of e.g. tantalum powder provided with various treatments such as chemical conversion coating, with electrical connection of the anode and cathode to the lead frame 22 as shown in FIG. 8(a), then resin molding a capacitor element part into a package 23 as shown in FIG. 8(b). In the exemplified case, a cathode is connected with the lead wire through a fuse 26. And, as the illustrative view of the section of the product is shown in FIG. 8(c), each lead is separated from the lead frame 22 and the leads 24, 25 are bent along the package 23 to manufacture an electronic component. And, it is, for example, placed on the pattern coated with a solder paste of the circuit substrate and then heated to be assembled into the circuit substrate.

In order to make the soldering performance favorable in soldering to the circuit substrate, the lead frame material is plated on its whole surface with, for example, a 91 solder (Sn:Pb=9:1) before being assembled.

However, when the solder as mentioned above is used, due to its high melting point, solder wettability is not sufficiently secured in mounting, and defective of mounting may result. On the other hand, it may be conceived to use a solder having low melting point, e.g., a 64 solder (Sn:Pb=6:4) as a material for solder plating, but when a 64 solder is used, the solder tends to fuse in molding for forming a package 23 or in mounting, causing a gap A between the leads 24, 25 and the package 23 [ref. FIG. 8(c)] to be formed, thereby providing a tendency for entry of water or the like and a problem of lowering of reliability.

As described above, in case of solder plating under the lead frame state, when a solder having a high melting point is used, no sufficient solder wettability can be secured for the lead frame in mounting into the circuit substrate or the like. Furthermore, when a solder having a low melting point is plated under the lead frame state, the solder is fused in the next molding or packaging to cause a gap to be formed between the lead and the package, leading to the problem of lowering of moisture resistance. To cope with this, there has been adopted a method of plating with a solder having low melting point only on the lead part which is exposed from the package after the molding, but it requires much increased number of work steps and provides a cause for hike in cost.

In addition, accompanied with the tendency of constriction in size of the electronic parts, the lead width becomes extremely fine to no more than about 1 mm, and the adhesion area by soldering becomes very small, so that there may be problems that the fixation capacity becomes insufficient when the wettability of the solder is not favorable even in a small extent, thus showing a tendency for the electronic parts to be disengaged under effect of vibration or external force, as shown in FIG. 9. In FIG. 9, the part 20 is a solid electrolytic capacitor, 31 is a substrate to be mounted such as circuit substrate, and 32 is a cream solder.

SUMMARY OF THE INVENTION

The present invention has been made to solve the problems as above, and its object is to provide an electronic component with which soldering performance can be improved in mounting by a simple work without causing a problem of moisture resistance between the lead and the package, and without requiring the work of number of steps of solder plating on the exposed leads after molding.

Another object of the present invention is to provide an electronic component of the structure that can improve fixation of the solder after mounting.

The electronic component according to the present invention comprises an electronic component chip, leads whose one end parts are electrically connected with the electrodes of the electronic component chip, and a package which covers the electronic component chip and the one end parts of the leads, wherein the other end parts of the leads are extended outside from the package, and bent along the outer wall of the package, and a solder bump of low melting point is held in the gap between the leads and the package.

By adopting this structure, when, for soldering the electronic component to a circuit substrate or the like, the electronic component is placed on the circuit substrate coated with a solder cream and the temperature is elevated, firstly a low melting point solder held between the leads and the package is fused to spread over the whole leads to provide good wettability, and then the cream solder is fused to run, thus running well to the whole leads, so that the soldering performance is improved.

If the above solder bump is stored in the recess provided in the package, sufficient amount of solder material can be retained. The recess can be formed either on the surface (back surface) of the side to be soldered on the circuit substrate or on the side wall. Alternatively, the solder bump may be fixed to the leads and stored in the recess, or fixed to the inside of the recess for storage.

If the through hole provided on the other end parts of the leads, the solder material goes into the through hole to cause increase in the adhesion area, thereby making it possible for the solder material to adhere to the other end parts of the leads in a clamping manner, thus providing great improvement to the fixation force.

Furthermore, due to the bending of the leads in a manner to make the other end parts thereof the soldered face and the through hole being continuously formed from the soldered face to the opposite side with respect to the bent portion, the applied solder is more easily filled up above the level of the soldered face, which is desirable.

The provision such that a part of the solder bump is to be accommodated in the through hole is desirable because the solder is made to run more easily to both the surface and the reverse face of the lead and to improve wettability.

The electronic component is formed of, for example, a solid electrolytic capacitor.

Another aspect of the electronic component of the present invention comprises an electronic component chip, leads for electrically connecting at its one end parts with electrodes of the electronic component chip and a package for covering the electronic component chip and the one end parts of the leads, wherein the other end parts of the leads are extended outside from the package, a through hole is provided on the other end parts, and a low melting point solder bump is retained in the through hole.

DETAILED DESCRIPTION

Figure 1:
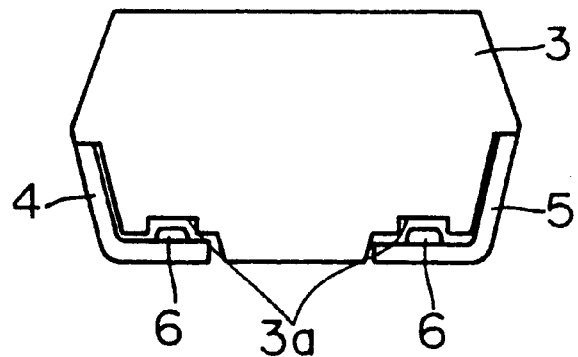
FIG. 1 is an illustrative view of the solid electrolytic capacitor which is an embodiment of the electronic component of the present invention.

The electronic component of the present invention comprises, as the lateral side view of the solid electrolytic capacitor which is an embodiment thereof is shown in FIG. 1, such that an electrode of the electronic component chip is electrically connected with the tip parts of the leads 4, 5, and the electronic component chip and the tips of the leads 4, 5 are covered by the package 3. The other end side of the leads 4,5 are extended out from the package 3, and the leads 4, 5 which are extended out from the package 3 are bent along the outer wall of the package 3, and a solder bump 6 of low melting point being held in the gap between the leads 4,5 and the package 3.

Figure 2:
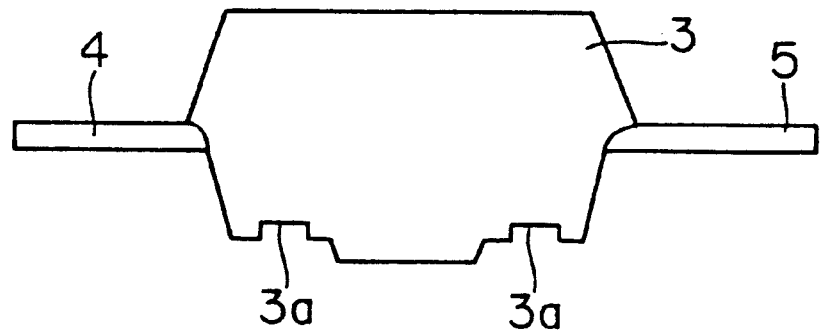
FIGS. 2(a) to 2(b) are views to show a manufacturing process of the solid electrolytic capacitor of FIG. 1.
Figure 2:
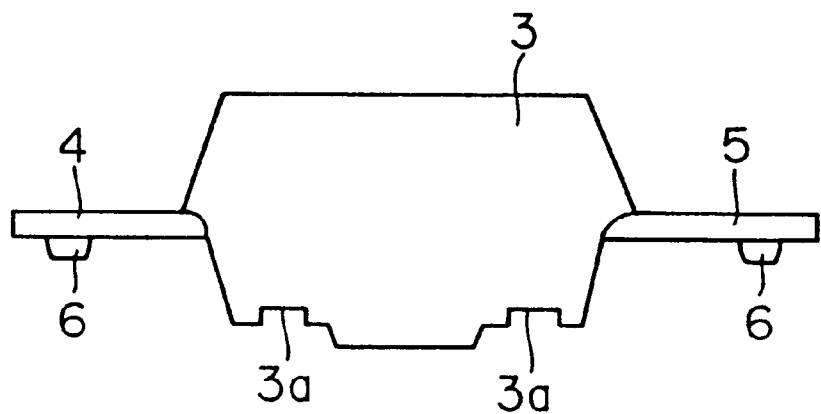

According to the embodiment shown in FIG. 1, as the drawing for its manufacturing process is shown in FIG. 2, a solder bump 6 is adhered onto the back side of the tip (end) parts of the leads 4, 5 extending out from the package 3, formed set back to the package 3 side. And, a recess 3a is formed on the package 3 of the related portion, and a solder bump 6 is accommodated in the recess 3a.

That is to say, in manufacturing the solid electrolytic capacitor, as shown in FIG. 2(a), a capacitor element chip is connected to leads of the frame and set to the mold, into which a resin is injected to form a package 3. At this time, a hollow space of the mold is formed so as to provide a recess 3a in the vicinity of the tip parts of the leads. And, by disengaging the leads from the lead frame, there is formed a mold product in which the leads 4, 5 extend from the package 3 as shown in FIG. 2(a). Subsequently, to the back face of the leads 4, 5 extending from the package 3, solder bumps 6 comprising the low melting point solder are adhered by wire bonding or the like. Thereafter, by bending the leads 4, 5 to the back side through the lateral side of the package 3, the leads 4, 5 are bent along the wall surface of the package 3 as shown in FIG. 1, and the solder bumps 6 provided at the tip of the leads 4, 5 are exactly accommodated in the recesses 3a provided on the package 3.

Figure 3:
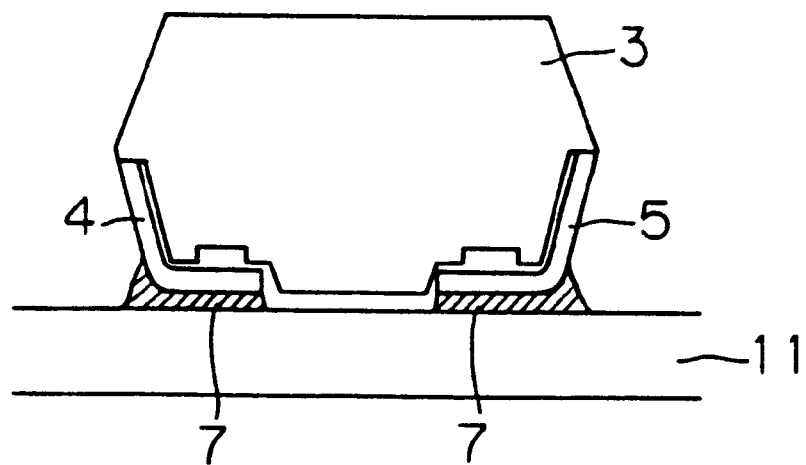
FIG. 3 is an illustrative view of mounting the solid electrolytic capacitor of FIG. 1 onto the circuit substrate.

In case of packaging the electronic component such as a solid electrolytic capacitor on a circuit substrate or the like, as shown in FIG. 3, a solder paste is applied to the wiring pattern on the circuit substrate 11, which is charged into a heating furnace to fuse the solder. In this case, because the solder bump is formed by a low melting point solder, the bump is fused at the time earlier than the solder paste to spread to the surroundings of the leads 4, 5 and run over the wiring pattern of the circuit substrate 11 to show good wetting. As a result, the solder bump has good affinity with the solder material 7 of the solder paste which is to be subsequently molten, and is favorably bonded to the wiring pattern of the circuit substrate 11.

According to the present invention, in the same manner as in the case of solder plating on the leads, the solder bump is wetted with the lead before soldering to improve soldering performance. Moreover, without requiring complicated process of plating only the leads after the molding, or without forming the problem of the peeling between the leads and the mold resin, a favorably soldered electronic component is obtainable at a low cost.

In the preceding embodiment, a solder bump is adhered to the tip of the lead by wire bonding or the like. However, even if the method is not the wire bonding, for example, even under the condition of applying the solder bump with a dispenser or the like, evaporating the solvent at about 100° C. to solidify, if the solder bump 6 is stored in the recess 3a of the package 3 by the forming of the leads 4, 5 as shown in FIG. 1, there is no danger for the solder bump to be peeled off to drop by the subsequent vibration or the like, and in mounting, heat is conducted from the leads to perform a role similar to that described above. According to the method of providing a solder bump by the dispenser, even without providing on the leads, by applying with a dispenser a solder bump 6 comprising the low melting point solder to the space in the recess 3a of the package 3 as shown in FIG. 4(a), and thereafter forming the leads, heating the resultant to about 100° C. to evaporate the solvent, there can be obtained an electronic component retaining the solder bump in the recess, in the same manner as that described above.

Figure 4:
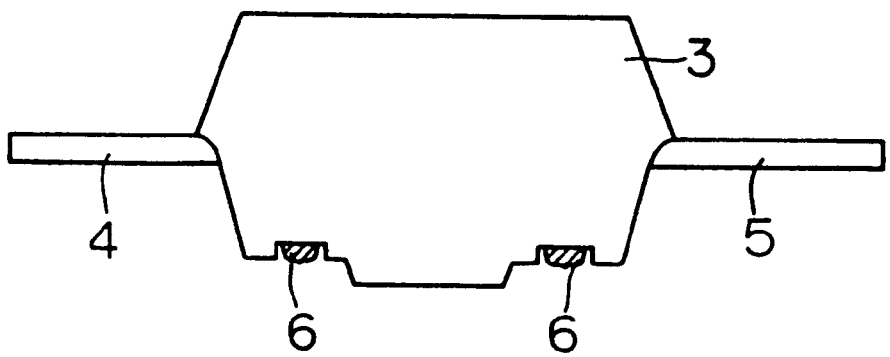
FIGS. 4(a) to 4(b) are illustrative views of the lateral side of the modified embodiment of FIG. 1.
Figure 4:
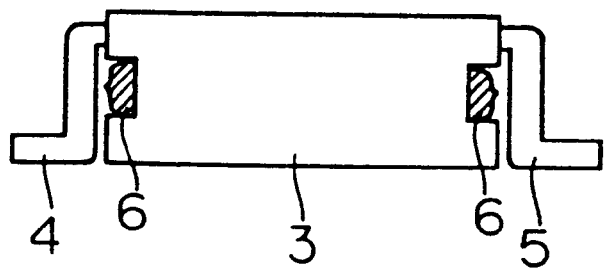

FIG. 4(b) shows a further modified embodiment of the case of forming by applying a solder bump in the recess of the package as described above. It is an embodiment which is particularly effective for the case where the tips of the leads are not bent to the back face side of the package, showing the case of forming a solder bump 6 on the side wall of the package 3 by a dispenser or the like. Even in this case, the solder bump can be provided in entirely the same manner as the case shown in FIG. 4(a). In this case, provision of the solder bump in a narrow space so that the solder bump comes into contact with the leads 4, 5 is desirable because the solder bump can be easily fused by the temperature elevation by heat conduction from the leads. Even in this case it is of course possible to provide a solder bump on the back side of the related part of the leads by wire bonding or by application.

As described above, due to the provision of the low melting point solder in the vicinity of the leads to be soldered, when the temperature rises, the low melting point solder is first fused to be wetted with the leads, thereby making the flow of the solder provided on the substrate side to be packaged favorable. A drawing showing the manufacturing process of the solid electrolytic capacitor having a structure to secure the location for holding the low temperature solder and further to improve the fixation property by solder is given in FIGS. 5(a) to 5(d). This example is the case where the through holes 4a, 5a are formed on the other end parts of the leads 4, 5 which are to be soldered (mounted) on the circuit substrate, the low temperature solders are held in the through holes 4a, 5a, and the solders at the time of the mounting are put into the through holes, thereby enlarging the adhesion area by solder and improving the fixation force by way of the structure of clamping the leads.

Figure 5A:
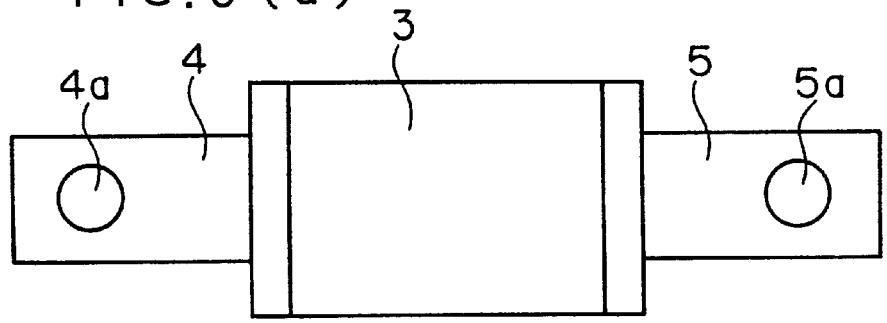
FIGS. 5(a) to 5(d) are illustrative views showing the manufacturing process of a solid electrolytic capacitor which is another embodiment of the electronic component of the present invention.
Figure 5B:
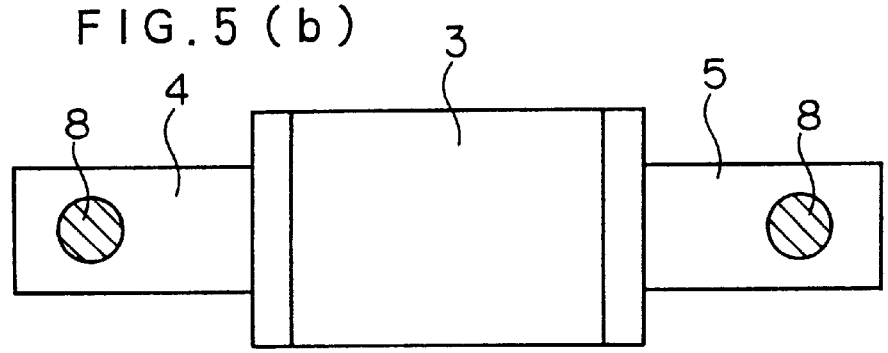
Figure 5C:
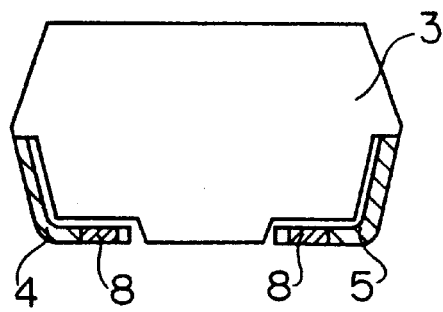
Figure 5D:
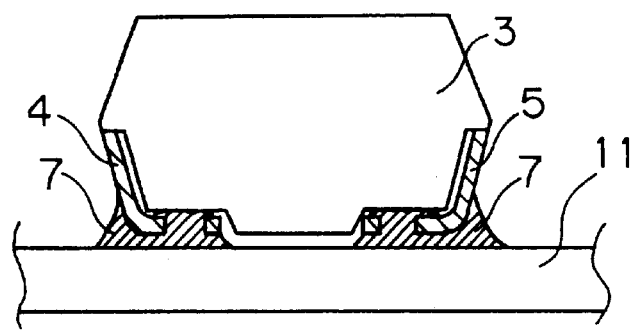

At first, as shown in FIG. 5(a) of a plan explanatory view, a non-illustrated capacitor element (chip) is connected to the leads 4, 5, to form a package 3 with a resin mold, and the leads 4, 5 are cut from the lead frame. Under the condition of the lead frame, through holes 4a, 5a are formed at the other end parts of the leads 4, 5 (the end parts corresponding to the other sides which are not the one end parts to be connected with the electrodes of the capacitor element). These through holes may be formed under the condition of being separated from the lead frame. And, under this state, the tip parts are soaked in the solder bath to fill the low temperature soldering material 8 in the through holes 4a, 5a (ref. FIG. 5(b)). Subsequently, as shown in FIG. 5(c), the leads 4, 5 are bent along the package 3, and forming is carried out. Next, the soldering faces of the leads 4, 5 are placed on the circuit substrate 11 coated with a solder material 7 comprising a solder paste and the substrate 11 are applied to the reflow furnace or the like to realize soldering as shown in FIG. 5(d). In FIGS. 5(c)–5(d), only the lead portions are shown by cross-sectional views. In this case, it does not need to bend the leads 4, 5 along the package 3, because the soldering material 8 (solder bump) is held in the through holes 4a, 5a.

According to this embodiment, the solder material 7 provided on the circuit substrate 11 side also enters into the through holes 4a, 5a of the leads 4, 5, and, as shown in FIG. 5(d), the solder flows onto the upper faces of the leads 4, 5 and bonded in a manner to be clamped by the solder. As a result, rigid connection with very strong fixation force can be obtained.

Figure 6:
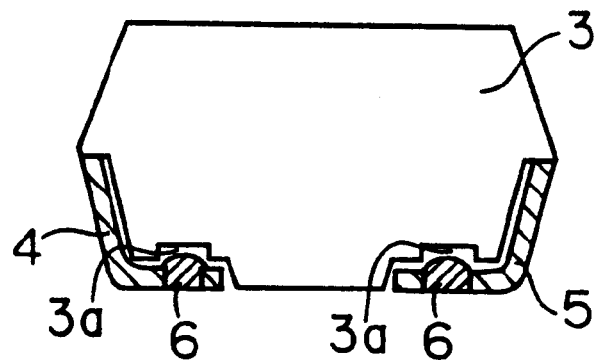
FIG. 6 is an illustrative view of the modified embodiment of FIG. 5.

With respect to the embodiment shown in FIG. 5, the low temperature soldering material 8 is filled only in the through holes 4a, 5a, so that, in view of the fineness of the leads 4, 5, there may be cases where very large through holes 4a, 5a cannot be provided, sufficient amount of low temperature soldering material 8 cannot be filled, and the leads cannot be sufficiently wetted with the low temperature soldering material 8. In such a case, as shown in FIG. 6 which illustrates in section only the leads 4, 5 and the solder bump 6, the solder bump 6 can be filled in the through holes 4a, 5a, or a solder bump 6 similar to that shown in FIG. 1 may be formed in the recess 3a of the package 3. By adopting such a structure, in soldering, at first a sufficient amount of low temperature solder sufficiently wets both the upper and the lower faces of the leads 4, 5 through the through holes 4a, 5a, and then the soldering materials for the non-illustrated circuit substrate and the like run. Accordingly, the solder runs sufficiently to both the upper and the lower faces of the leads 4, 5 to effect soldering in a clamping manner to give strong fixation force.

Figure 7:
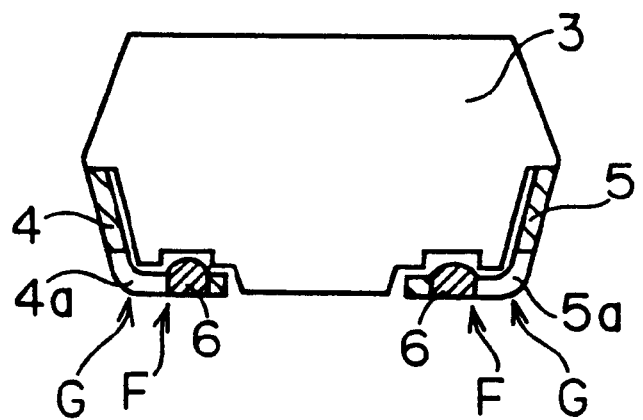
FIG. 7 is an illustrative view of further modified embodiment of FIG. 5.

FIG. 7 is an embodiment with modification of the configuration of the through holes 4a, 5a, showing in section only the leads 4, 5 and a part of the solder bump 6. In this embodiment, the tips (the other ends in the embodiment described above) of the leads 4, 5 are bent to form a soldering face F. In this embodiment, the through holes 4a, 5a are formed not only on the soldering face F but also continuously from the bent portion G further to the side opposite to the soldering face. By the formation of such long through holes 4a, 5a, the soldering material for the non-illustrated circuit substrate runs up to the upper part along the through holes 4a, 5a, to provide stronger fixation. Moreover, as in this embodiment, by so providing as to accommodate a part of the solder bump 6 in the through holes 4a, 5a, the low moisture solder can be sufficiently retained in the gap even if the gap between the leads 4, 5 and the package 3 is narrow.

Figure 8A:
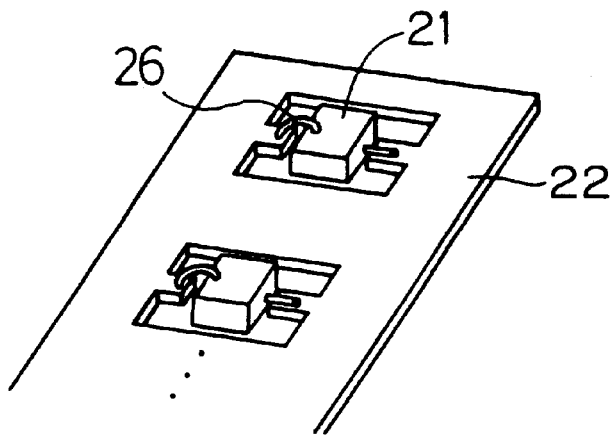
FIGS. 8(a) to 8(c) are illustrative views showing the manufacturing process and the section of the product of conventional solid electrolytic capacitor.
Figure 8B:
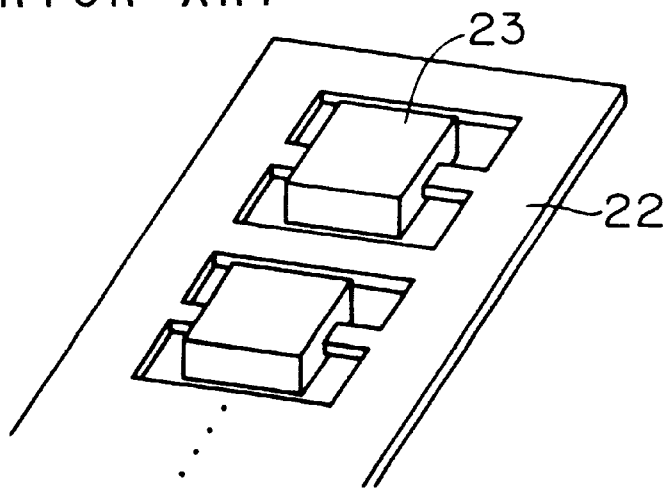
Figure 8C:
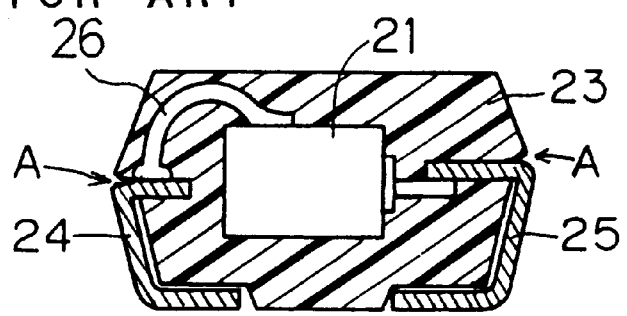
Figure 9:
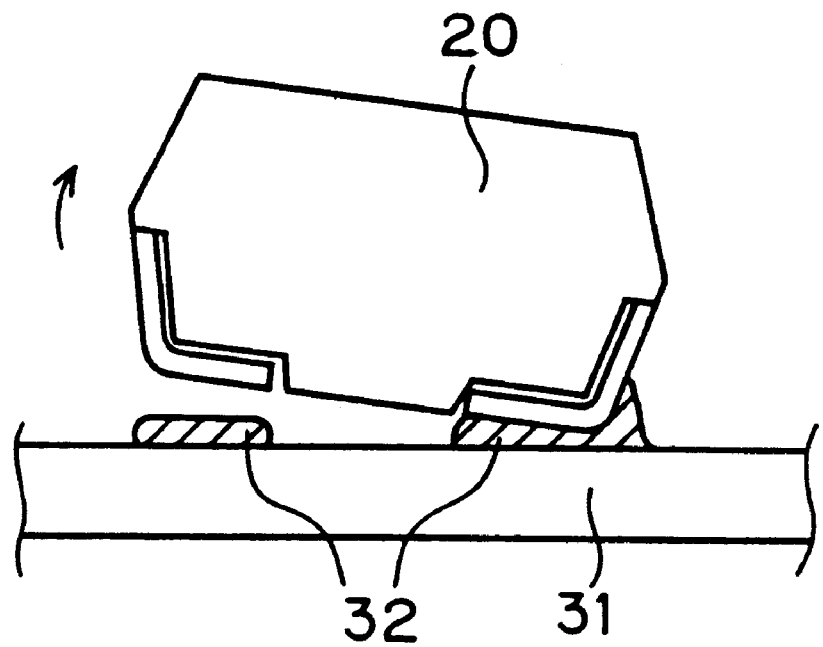
FIG. 9 is an illustrative view of other problematic points of conventional solid electrolytic capacitor.

In each of the foregoing embodiments recesses are formed on the package to which a solder bump is to be provided. However, even if no recess is formed, it is allowable if a gap is formed between the leads and the package. Alternatively, a solder bump may be applied with a dispenser or the like to a gap between the leads and the package after forming the leads. Though the embodiments mentioned above referred to the solid electrolytic capacitors, in case of the solid electrolytic capacitors, there are included ones having the fuse connection structures as shown in FIG. 8, and besides those having no fuse connection but direct connection between the cathode of the capacitor element and the leads. Furthermore, the same effects are available with the semiconductor devices such as diodes, transistors, ICs, etc. other than the solid electrolytic capacitor.

According to the present invention, because, instead of the complicated process of solder plating or the like, a solder bump which can be simply wetted with the lead is retained in the vicinity of the lead, there occurs no soldering defect in case of the packaging on the circuit substrate or the like. Moreover, tight contact property between the lead and the package is sufficiently obtained, and the electronic components having excellent moisture resistance and high reliability are obtainable at a low cost.

In addition, because a through hole is provided on the soldering surface side at the tip of the lead and the low temperature solder is retained in the through hole, it becomes possible to self-contain a low temperature solder in a small space. Also, because, in soldering, the solder runs through the through hole and comes into contact in wide area, and adhesion can be made in a clamping manner from the surroundings of the lead, a more intensive fixation can be realized.

Although preferred example have been described in some detail, it is to be understood that certain changes can be made by those skilled in the art without departing from the spirit and scope of the invention as defined by the appended claims.

What is claimed is:

1. An electronic component comprising:

an electronic component chip;

leads for electrically connecting at a first end part with electrodes of said electronic component chip; and a package for covering said electronic component chip and said first end part of said leads, wherein a second end part of each of said leads is extended outside from said package, and bent along an outer wall of said package, and a projecting portion of a low melting point solder bump is retained in a gap between said leads and package before soldering said leads to a substrate.

2. An electronic component according to claim 1, wherein said solder bump is accommodated in a recess provided on said package.

3. An electronic component according to claim 2, wherein said recess is formed on a face of said package on a side to be soldered.

4. An electronic component according to claim 2, wherein said solder bump is fixed to said leads and accommodated in said recess.

5. An electronic component according to claim 2, wherein said solder bump is fixed in said recess of said package.

6. An electronic component according to claim 1, wherein a through hole is provided on said second end part of each of said leads.

7. An electronic component according to claim 6, wherein said second end part of said leads is bent to be a soldered face, and said through hole is continuously formed from said soldered face to an opposite side with respect to a bent portion.

8. An electronic component according to claim 6, wherein said solder bump is provided in a manner that a part of said solder bump is accommodated in said through hole.

9. An electronic component according to claim 1, wherein said electronic component chip is a solid electrolytic capacitor.

* * * * *